US010838468B2

(12) United States Patent
Bikumala et al.

(10) Patent No.: US 10,838,468 B2
(45) Date of Patent: Nov. 17, 2020

(54) MOUNTING A CAMERA BEHIND A TRANSPARENT ORGANIC LIGHT EMITTING DIODE (TOLED) DISPLAY

(71) Applicant: EMC IP Holding Company LLC, Hopkinton, MA (US)

(72) Inventors: Sathish Kumar Bikumala, Round Rock, TX (US); Jace W. Files, Round Rock, TX (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/259,377

(22) Filed: Jan. 28, 2019

(65) Prior Publication Data

US 2020/0241607 A1    Jul. 30, 2020

(51) Int. Cl.
*G06F 1/16* (2006.01)
*G06T 5/00* (2006.01)
*H01L 51/52* (2006.01)
*H01L 27/32* (2006.01)

(52) U.S. Cl.
CPC .......... *G06F 1/1686* (2013.01); *G06T 5/003* (2013.01); *H01L 27/3234* (2013.01); *H01L 51/5234* (2013.01); *G06T 2207/10004* (2013.01); *G06T 2207/10016* (2013.01); *H01L 2251/5323* (2013.01)

(58) Field of Classification Search
CPC ..... G06F 1/1686; G06F 1/1637; G06T 5/003; G06T 2207/10016; G06T 2207/10004; H01L 51/5234; H01L 27/3234; H01L 2251/5323
See application file for complete search history.

(56) References Cited

U.S. PATENT DOCUMENTS

| 5,243,413 | A  | * | 9/1993  | Gitlin    | H04N 7/144   |
|           |    |   |         |           | 348/14.15    |
| 7,196,728 | B2 | * | 3/2007  | Campbell  | H04N 7/144   |
|           |    |   |         |           | 348/340      |
| 7,697,053 | B2 | * | 4/2010  | Kurtz     | H04N 7/144   |
|           |    |   |         |           | 348/333.01   |
| 8,022,977 | B2 | * | 9/2011  | Kanade    | H04N 5/23293 |
|           |    |   |         |           | 345/207      |
| 9,204,089 | B2 | * | 12/2015 | Nagano    | H04N 7/144   |
| 9,392,219 | B2 | * | 7/2016  | Robinson  | G09G 3/3406  |

(Continued)

*Primary Examiner* — Grant Sitta
(74) *Attorney, Agent, or Firm* — Campbell Stephenson LLP; Shiv S. Naimpally (57) ABSTRACT

In some examples, a computing device includes a display panel comprising a transparent organic light emitting diode panel. A camera is located behind a particular portion of the display panel. A set of pixels cover the particular portion of the display panel. The computing device creates a capture frame comprised of layers that includes a camera layer having a higher priority than a remainder of the layers. The computing device sets the set of pixels in the camera layer to be clear pixels and instructs the display panel to display the capture frame. The computing device instructs the camera located behind the particular portion of the display panel to capture image data when the display panel displays the capture frame. The computing device creates a data frame comprised of additional layers and instructs the display panel to display the data frame after displaying the capture frame.

14 Claims, 10 Drawing Sheets

(56) References Cited

U.S. PATENT DOCUMENTS

| | | | | |
|---|---|---|---|---|
| 9,740,295 B2* | 8/2017 | Shen | ............ | G06F 3/0416 |
| 9,864,400 B2* | 1/2018 | Evans, V | ............ | G06F 1/1605 |
| 10,225,458 B2* | 3/2019 | Cho | ............ | G02F 1/133509 |
| 10,331,164 B2* | 6/2019 | Bao | ............ | G06F 1/1686 |
| 10,460,656 B2* | 10/2019 | Xi | ............ | G09G 3/3208 |
| 10,672,852 B1* | 6/2020 | Chen | ............ | H05B 47/11 |
| 2004/0257473 A1* | 12/2004 | Miyagawa | ............ | H04N 7/144 348/571 |
| 2008/0165267 A1* | 7/2008 | Cok | ............ | H04N 7/144 348/333.01 |
| 2009/0102763 A1* | 4/2009 | Border | ............ | H04N 7/144 345/87 |
| 2009/0322706 A1* | 12/2009 | Austin | ............ | G06F 3/0488 345/175 |
| 2010/0171759 A1* | 7/2010 | Nickolov | ............ | G06T 3/40 345/634 |
| 2010/0309233 A1* | 12/2010 | Choi | ............ | G03B 21/00 345/690 |
| 2011/0279689 A1* | 11/2011 | Maglaque | ............ | H04N 5/2253 348/207.1 |
| 2013/0176512 A1* | 7/2013 | Posner | ............ | G02F 1/1333 349/33 |
| 2013/0182062 A1* | 7/2013 | Son | ............ | H04N 7/144 348/14.07 |
| 2013/0328051 A1* | 12/2013 | Franklin | ............ | G06F 1/1643 257/59 |
| 2014/0184521 A1* | 7/2014 | Kwong | ............ | G03B 17/12 345/173 |
| 2014/0306957 A1* | 10/2014 | Herrick | ............ | G09G 5/14 345/422 |
| 2015/0035936 A1* | 2/2015 | Robinson | ............ | G09G 3/3406 348/14.08 |
| 2015/0049165 A1* | 2/2015 | Choi | ............ | H04N 7/144 348/14.16 |
| 2015/0212583 A1* | 7/2015 | Shen | ............ | G06F 3/005 345/156 |
| 2015/0271392 A1* | 9/2015 | Musgrave | ............ | G09G 3/36 348/207.11 |
| 2015/0279020 A1* | 10/2015 | Gupta | ............ | G09G 3/006 348/92 |
| 2016/0240172 A1* | 8/2016 | Singh | ............ | G09G 5/393 |
| 2016/0328633 A1* | 11/2016 | Pan | ............ | G06F 3/1208 |
| 2017/0084231 A1* | 3/2017 | Chew | ............ | G06F 1/1686 |
| 2017/0200251 A1* | 7/2017 | Aubineau | ............ | G09G 5/18 |
| 2017/0251137 A1* | 8/2017 | Evans, V | ............ | H04N 5/2354 |
| 2017/0316541 A1* | 11/2017 | Kim | ............ | G06T 1/20 |
| 2017/0329613 A1* | 11/2017 | Croxford | ............ | G06F 9/451 |
| 2018/0330468 A1* | 11/2018 | Mao | ............ | G06T 1/60 |
| 2019/0037170 A1* | 1/2019 | Zimmerman | ............ | H04N 5/232 |
| 2019/0043248 A1* | 2/2019 | Trandafir | ............ | G06T 15/503 |
| 2019/0051026 A1* | 2/2019 | Yeung | ............ | G06T 15/005 |

* cited by examiner

MOUNTING A CAMERA BEHIND A TRANSPARENT ORGANIC LIGHT EMITTING DIODE (TOLED) DISPLAY

BACKGROUND OF THE INVENTION

Field of the Invention

This invention relates generally to display devices and more particularly to mounting a camera behind a transparent organic light emitting diode (TOLED) display.

DESCRIPTION OF THE RELATED ART

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A display device may be a standalone device or part of a portable computing device (e.g., a smartphone, a smartwatch, a tablet, a laptop, or the like). As the bezel around display devices shrink to become narrower and narrower (e.g., "infinity edge" displays), the bezel may lack sufficient space to incorporate a camera (e.g., a webcam). One solution is to make one edge of the bezel sufficiently wide to accommodate an embedded camera. For example, the bottom edge of the display device of a laptop may be wider than the other edges to enable a camera to be incorporated into the bottom edge. However, such a camera placement causes images to be captured at an odd angle, e.g., the images may capture a view that is looking up at the user's nostrils. Such a camera placement may not be ideal when the camera is used for videoconferencing and the like as participants may have difficulties in seeing the user from a normal perspective.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing device includes a display panel comprising a transparent organic light emitting diode panel. A camera is located behind a particular portion of the display panel. A set of pixels cover the particular portion of the display panel. The computing device creates a capture frame comprised of layers that includes a camera layer having a higher priority than a remainder of the layers. The computing device sets the set of pixels in the camera layer to be clear pixels and instructs the display panel to display the capture frame. The computing device instructs the camera located behind the particular portion of the display panel to capture image data during a time when the display panel displays the capture frame. The computing device creates a data frame comprised of additional layers and instructs the display panel to display the data frame after displaying the capture frame.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques enable a camera to be located behind a display panel of a display device (e.g., part of an information handling system) to capture image data in which a user is facing the camera. The camera is positioned at a location within a housing of the display device to reduce optical distortion as compared to when the camera is located in a bezel of the display device. For example, in a conventional display device in which the camera is located in the bezel of the display device, the camera may have a field of view that is at an angle relative to a front of the user's face, causing significant optical distortion. By locating the camera behind the display panel, such optical distortion is reduced, making it appear to others (e.g., who are viewing image data captured by the camera) that the user is directly facing the camera. For applications, such as video conferencing, the reduction in optical distortion creates an improved user experience as compared to when the camera is located in the bezel of the display device.

A display device may include a housing. The housing may include a display panel, such as a transparent organic light emitting diode (TOLED) panel. A camera may be located behind the TOLED panel in the housing. The display device may be a standalone display device that is connected to a video output of (i) a computing device (e.g., an IHS), such as a desktop computing device, or (ii) a docking station (e.g., with a laptop computing device or other IHS connected to the docking station). The display device may be part of a computing device (e.g. an IHS), such as a tablet, a smartwatch, a smartphone, or the like, in which a processor, memory, and other components of the computing device are located inside the housing.

The camera may include a lens and a sensor. The lens may take information in a field of view of the lens and project an image onto the sensor. The sensor may capture image data, e.g., a digital representation of the image.

The TOLED panel may include multiple pixels. Each of the pixels may include a red component, a green component, a blue component, and a clear component. The red component may emit red color frequencies (e.g., about 430 to 480 THz), the green component may emit green color frequencies (e.g., about 540 to 580 THz), and the blue component may emit blue color frequencies (e.g., about 610 to 670 THz). When the red, green, or blue components emit a color, the color permeates the clear component of the pixel, causing the pixel to be viewed as the color that is being emitted. By combining different intensities of red, green, and blue, each pixel can be made to emit a rainbow of colors. To display a white pixel, the red, green, and blue components may all emit colors at an equal intensity. To display a black pixel, the red, green, and blue components may not emit any color (e.g., zero intensity). In a TOLED panel, which has a clear substrate (e.g., made of glass or clear plastic), displaying a black pixel causes the area where the pixel is located to become transparent. When the TOLED panel is transparent, a user facing one side of the TOLED panel is be able to view, through the clear substrate, whatever is located on the other side of the TOLED panel.

The multiple pixels of the TOLED panel may include a set of pixels that each cover at least a portion of the camera that is mounted behind the panel. A set of pixels is one or more pixels. To enable the camera to capture an image, the set of pixels may be temporarily made transparent for a length of time sufficient to capture the image, e.g., a few milliseconds. The clear portion of the pixel allows between about 70% to 90% of light to pass through (e.g., similar to looking through a lightly tinted window). To compensate, the image data captured by the camera may be modified (e.g., by increasing brightness, modifying contrast, increasing saturation, increasing sharpness, adjusting white balance, performing another adjustment to the image data, or any combination thereof) to compensate for the light transmission loss through the TOLED.

To enable image data capture without degrading the user experience, data capture frames may be interleaved with data frames. A data frame may display data on the TOLED. A date capture frame may display data except for the set of pixels in front of the camera. In a data capture frame, the set of pixels that each cover at least part of the camera are set to not display any color. When the set of pixels each do not display a color, the area which the set of pixels occupy becomes transparent, enabling the camera to capture image data.

For example, if the display device is capable of displaying video data at 60 frames per second (fps), then the camera is able to capture image data in alternate frames (e.g., in the interleaved capture frames), at 30 fps. Due to the high display rate of 60 fps and because the area occupied by the set of pixels is relatively small (e.g., relative to the total number of pixels displayed by the TOLED panel), a user may perceive a slight darkening of the area occupied by the set of pixels when the camera is being used. Because of this, the user experience is not negatively affected when using interleaved capture frames to capture image data.

To create a frame to be displayed on a display device, a graphic processing unit (GPU) may layer multiple layers. Each of the layers may have a particular priority, with a higher priority layer being displayed on top of a lower priority layer. For example, an operating system may display a desktop (e.g., a first layer with a priority of 1) with various icons, such as an icon of an application, an icon of a file, an icon of a folder, and the like. The icons may have a higher priority (e.g., the icons may be in a second layer having a priority of 2) than the desktop and are therefore displayed on top of the desktop. When a user opens a folder, at least a portion of the contents of the open folder are displayed. The open folder has a higher priority (e.g., the folder may be in a third layer with a priority of 3) than the icons and therefore covers any icons located below the open folder, as well as a portion of the desktop that is located below the open folder.

To create a capture frame, the GPU may create a camera layer that includes transparent pixels to enable the camera to capture image data. For example, the GPU may cause the set of pixels that cover at least a portion of the camera to have a black value (e.g., each of the red, green, and blue components do not emit a color), resulting in the set of pixels being clear. The GPU may assign a highest priority to the camera layer. Each of the layers has a lower priority as compared to the highest priority of the camera layer. The GPU renders each capture frame by creating a two-dimensional representation of the multiple layers. Because the camera layer has a highest priority, the pixels in the capture frame rendered by the GPU are set to a black color, causing all of the pixels to not emit any color. By not emitting any color, the area in the capture frame that is occupied by the set of pixels (that are in front of the camera) is clear, enabling the camera to capture image data.

Figure 1:
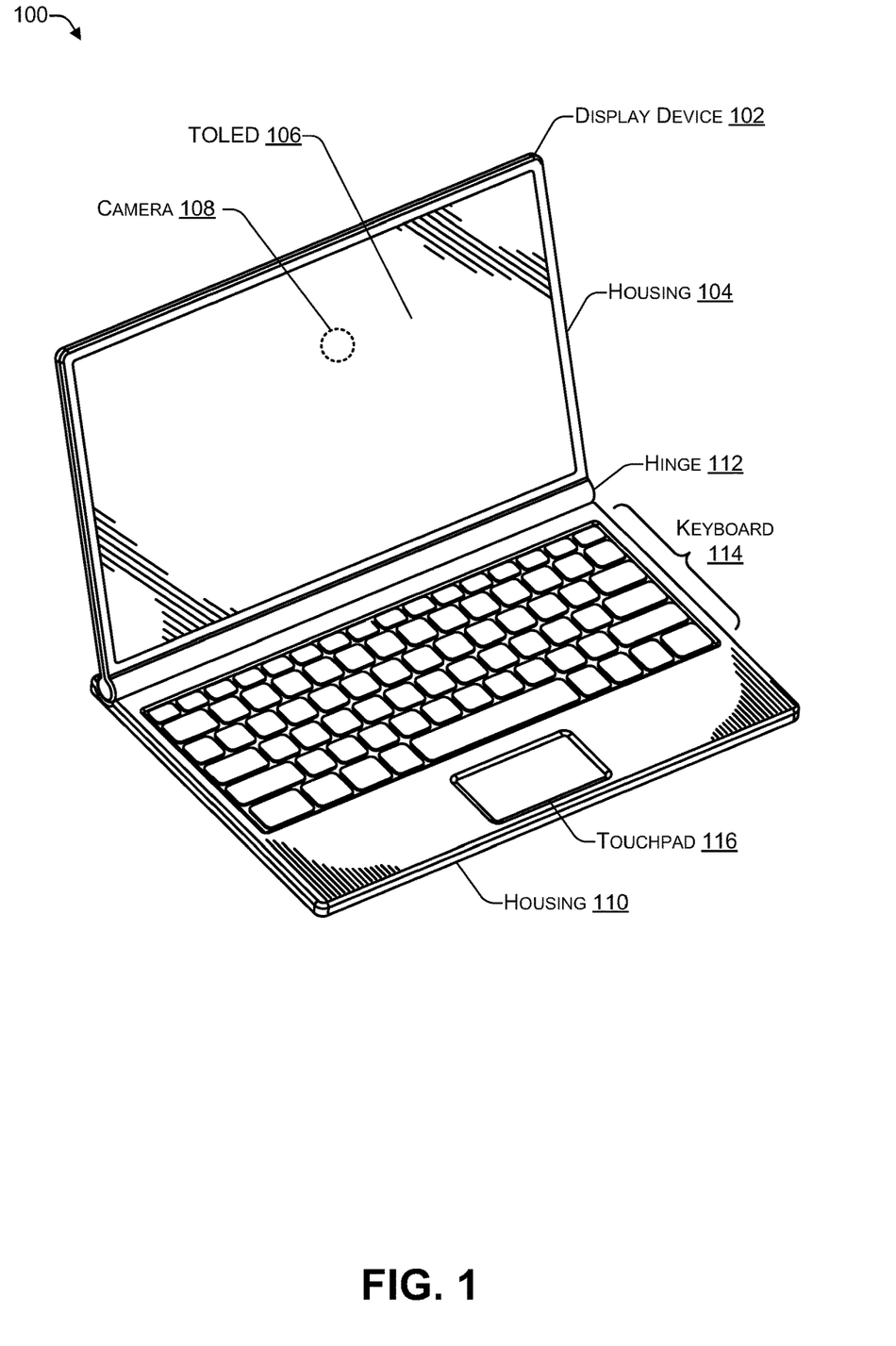
FIG. 1 is a block diagram of a display device that includes a camera behind a display panel according to some embodiments.

As an example, a computing device includes a display panel, a processor (e.g., a graphic processing unit (GPU)), and one or more non-transitory computer-readable storage media storing instructions. For example, the computing device may be a smartwatch, a smartphone, a tablet, a laptop, a 2-in-1 device (e.g., a laptop in which the head can be detached from the base for use as a tablet), an all-in-one device (e.g., a display device that houses the processor and non-transitory storage media behind the display panel), a desktop device connected to a display device, or another type of computing device. The display panel may include a transparent organic light emitting diode (TOLED) panel. A thickness of the TOLED panel is 0.2 millimeters or less. The computing device may include a camera located behind a particular portion of the display panel. The instructions are executable by the processor to perform various operations. For example, the operations include creating a capture frame comprised of a plurality of layers that include a camera layer and assigning the camera layer a higher priority than remaining layers of the plurality of layers. The operations may include setting individual pixels of a set of pixels in the camera layer that cover the particular portion of the display panel to be clear pixels (e.g., black colored pixels in which the red, green, and blue components of each pixel do not emit any color). For example, setting the set of pixels covering the particular portion of the display panel to be clear pixels may include determining the set of pixels that cover the particular portion of the display panel and setting individual pixels of the set of pixels to not emit a color. The operations may include instructing the display panel to display the capture frame and, substantially simultaneously, instructing the camera located behind the particular portion of the display panel to capture image data (e.g., during a time when the display panel is displaying the capture frame. The operations may include performing a modification to the image data to create modified image data. For example, the modification may include at least one of: increasing a brightness of the image data, increasing a contrast of the image data, increasing a saturation of the image data, increasing a sharpness of the image data, or adjusting a white balance of the image data. The operations may include creating a data frame comprised of a second plurality of layers and instructing the display panel to display the data frame after displaying the capture frame. In some cases, the computing device may repeatedly create and cause to be displayed a capture frame followed by a data frame to enable the camera to capture video images. For example, a sequence of interleaved capture frames and data frames may be displayed at a particular frame rate, such as, for example, 30 fps, 60 fps, 120, fps, 240 fps, or the like. The capture frames may capture video at rates of 15 fps, 30 fps, or the like, depending on the interleave ratio. For example, the display panel may display the capture frame for one thirtieth of a second (at 30 fps) or one sixtieth of a second (at 60 fps). In the case of a laptop or a desktop computing device, the computing device may include a first housing in which the display panel and the camera are located and a second housing in which the processor and the one or more non-transitory computer-readable storage media are located. In the case of a smartwatch, a smartphone, a tablet, or a 2-in-1 device, the computing device may include a housing in which the display panel, the camera, the processor, and the one or more non-transitory computer-readable storage media are located FIG. 1 is a block diagram 100 of a display device that includes a camera behind a display panel according to some embodiments. A display device 102 may include a housing 104. The housing 104 may include a display panel, such as a transparent organic light emitting diode (TOLED) panel 106. A camera 108 may be located behind the TOLED panel 106 in the housing 104.

In some implementations, the display device 102 may be a standalone display device that is connected to a video output of (i) a computing device, such as a desktop computing device, or (ii) a docking station (e.g., with a laptop computing device connected to the docking station). In other implementations (e.g., in a tablet, a smartwatch, or a smartphone), a processor, memory, and other components of a computing device may be located inside the housing 104. In still other implementations (e.g., in a laptop computing device), the housing 104 may be attached to a second housing 110. In a laptop computing device, the housing 110 may include additional components, such as a keyboard 114 and a touchpad 116.

Figure 2:
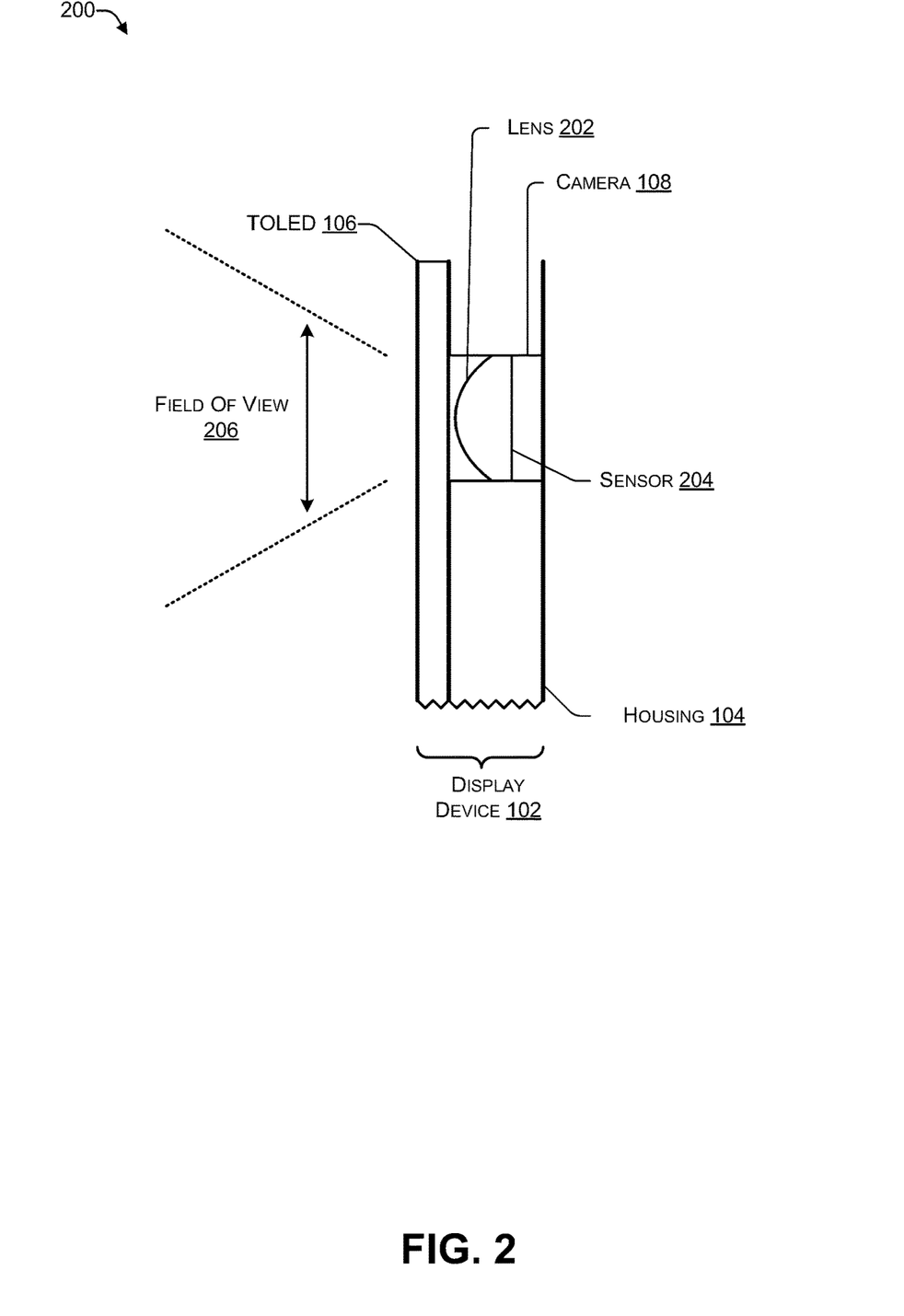
FIG. 2 is a block diagram illustrating a cutaway view of a display device in which a camera is mounted behind a display panel according to some embodiments.

FIG. 2 is a block diagram 200 illustrating a cutaway view of a display device in which a camera is mounted behind a display panel according to some embodiments. In the housing 104 of the display device 102, the camera 108 may be mounted behind the TOLED panel 106, as illustrated in FIG. 2.

The camera 108 may include a lens 202 and a sensor 204. The lens 202 may take information in a field of view 206 of the lens 202 and project an image onto the sensor 204. The sensor 204 may capture image data, e.g., a digital representation of the image.

Figure 3:
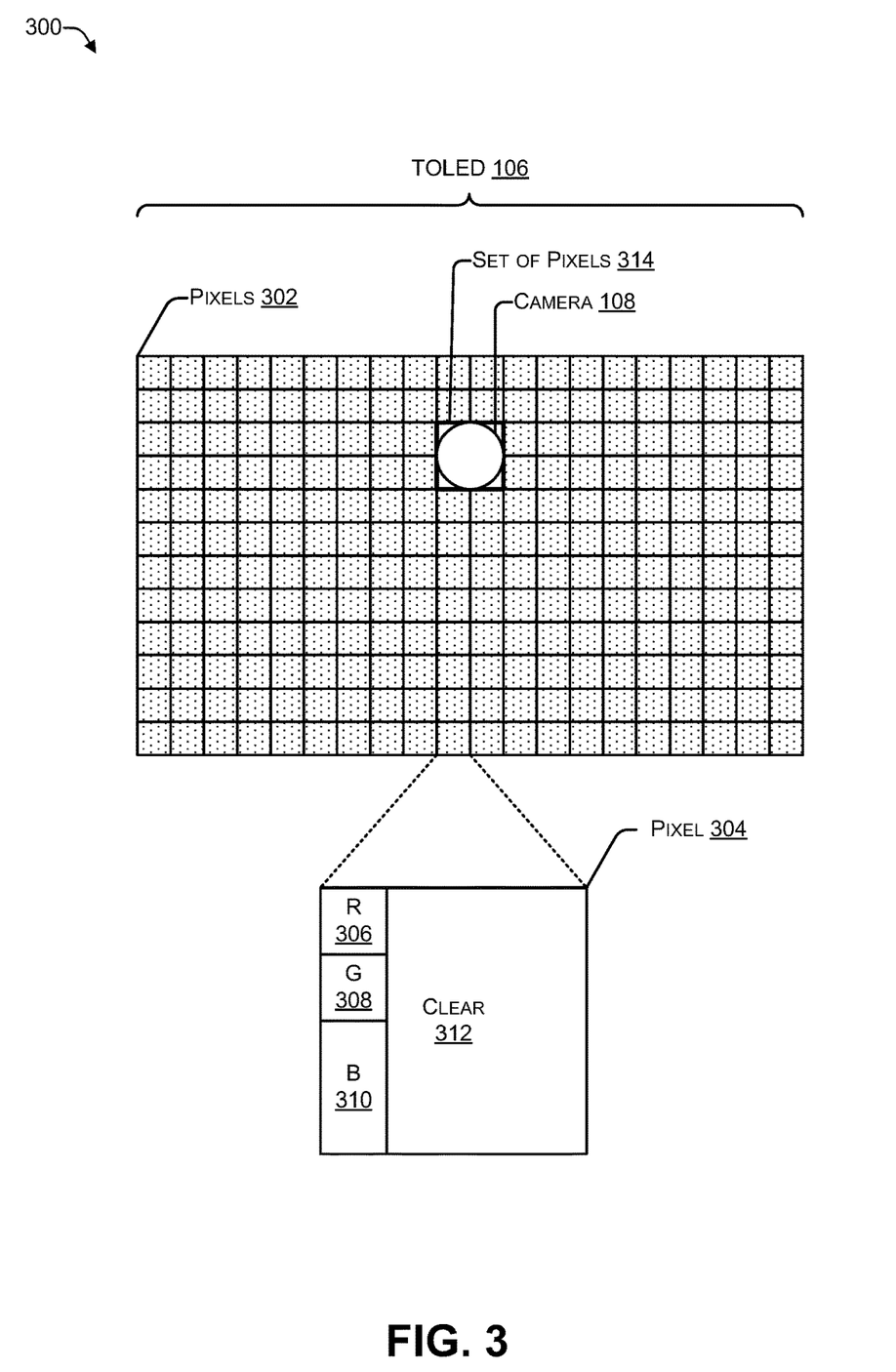
FIG. 3 is a block diagram illustrating a set of pixels that are kept transparent when a camera is being used according to some embodiments.

FIG. 3 is a block diagram 300 illustrating a set of pixels that are kept transparent when a camera is being used according to some embodiments. The TOLED panel 106 may include multiple pixels 302. A representative pixel 304 of the pixels 302 may include a red (R) 306 component, a green (G) 308 component, a blue (B) 310 component, and a clear 312 component. The component R 306 may emit red color frequencies (e.g., about 430 to 480 terahertz (THz)), the component G 308 may emit green color frequencies (e.g., about 540 to 580 THz), and B 310 may emit blue color frequencies (e.g., about 610 to 670 THz).

The representative pixel 304 may emit various colors by using different combinations of R 306, G 308, and B 310. For example, causing one or more of R 306, G 308, and B 310 to emit a corresponding color may result in the colors mixing and permeating the clear 312 portion of the pixel 304.

A set of (e.g., one or more) pixels 314 that are in front of and that cover at least a portion of the camera 108 may be identified. To enable the camera 108 to capture an image, the set of pixels 314 may be temporarily made transparent for a length of time sufficient to capture the image, e.g., typically a few milliseconds (e.g., 16.7 milliseconds when displaying frames at 60 frames per second (fps)). For an OLED panel, a transparent pixel is referred to as a pixel having a black color in which each of R 306, G 308, and B 310 do not emit any color.

The clear 312 portion of the pixel 304 typically allows 70% to 90% of light to pass through (e.g., similar to looking through a lightly tinted window). To compensate, image data captured by the camera 108 through the set of pixels 314 may be color adjusted (e.g., by increasing brightness, modifying contrast, increasing saturation, adjusting white balance, performing another adjustment to the image data, or any combination thereof) to compensate for the light transmission loss through the set of pixels 314.

Figure 4:
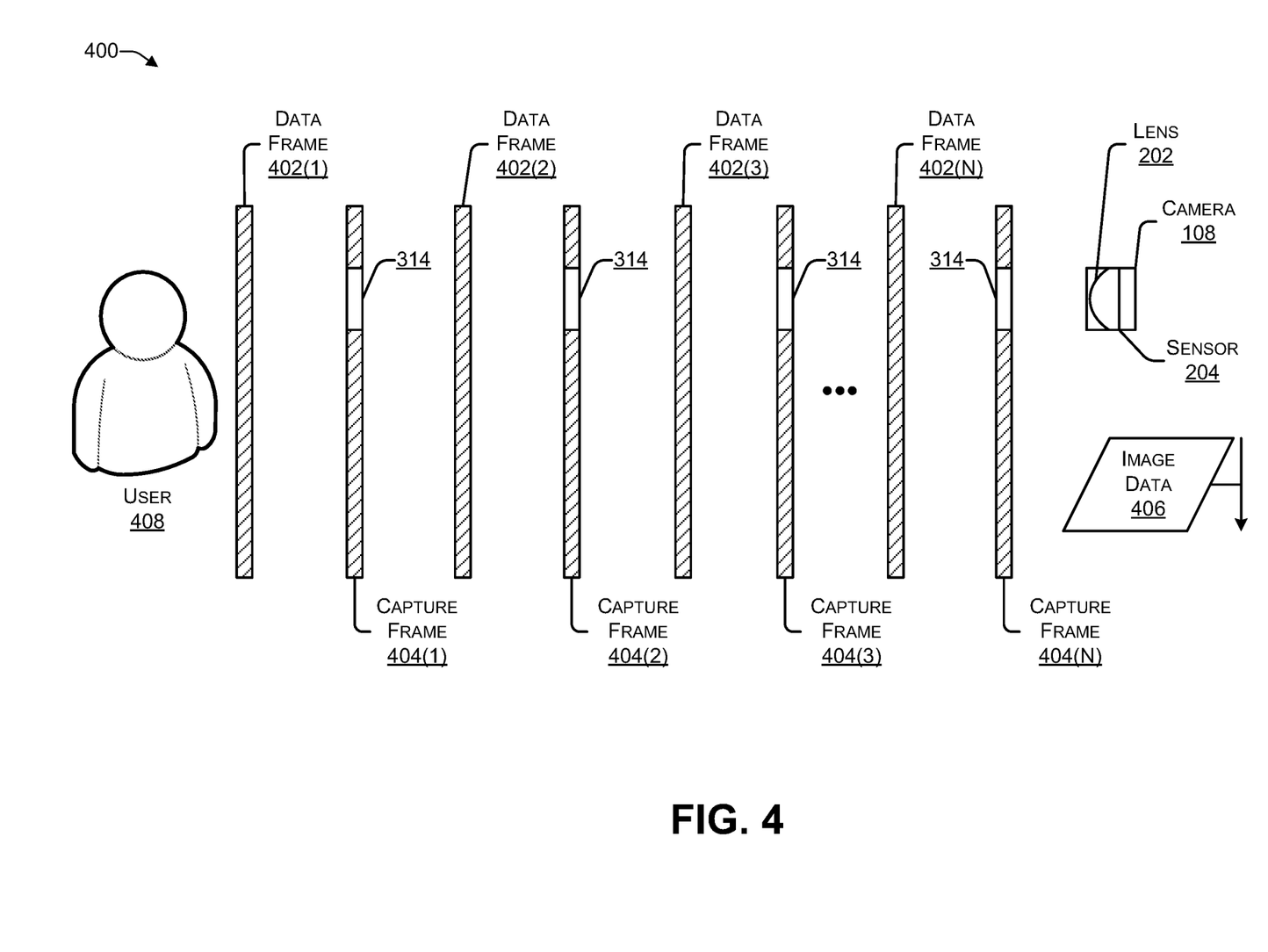
FIG. 4 is a block diagram illustrating interleaving video frames with camera capture frames according to some embodiments.

FIG. 4 is a block diagram 400 illustrating interleaving video frames with camera capture frames according to some embodiments. Capture frames 402(1), 402(2), 402(3), to 402(N) (where N>0) may be used to display data, e.g., a desktop, open folders, application output and the like. For example, for a video conferencing application, the output may include a video conferencing window with streaming video.

Interleaved with the frames 402 are capture frames 404(1), 404(2), 404(3), to 404(N) that are used to display data and to capture image data 406. In each of the frames 404, the set of pixels 314 are set to transparent to enable the camera 108 to capture the image data 406. For example, when a video conferencing application is being used, the image data 406 captured by the camera 108 may include an image of a user 408.

For illustration purposes, assume that the display device 102 is capable of displaying video data at 60 frames per second (fps). In this example, the camera 108 captures video in alternate frames (the capture frames 404), at 30 fps (e.g., N=30). The display device 102 of FIG. 1 may display thirty of the data frames 402 in one second and, in-between the data frames 402, display the captures frames 404. When each of the capture frames 404 is displayed, the camera 108 may capture the image data 406.

Due to the relatively high display rate of 60 fps and because only the set of pixels 314 that are covering portions of the camera 108 are made transparent, the user 408 may perceive a slight darkening of the set of pixels 314 when the camera 108 is being used. In this way, the user experience is not adversely affected when using interleaved capture frames 404 to capture the image data 406.

Of course, other interleaving rates may be used depending on the capabilities of the display device 102, the capabilities of a graphic processing unit (GPU) providing video data to the display device 102, the transmission bandwidth for video conferencing, and the like. For example, data may be displayed at 120 fps and video captured using the camera 108 at 60 fps (e.g., N=60). As another example, data may be displayed at 240 fps and video captured using the camera 108 at 120 fps (e.g., N=120). As yet another example, data may be displayed at 30 fps and video captured using the camera 108 at 15 fps (e.g., N=15). In this example, 15 fps may result in somewhat reduced video quality (e.g., "jerky" video) but may be used to conserve bandwidth when transmission bandwidth is limited.

While FIG. 4 illustrates using a 1:1 interleave, other interleave ratios may also be used. For example, for 60 fps video, using a 2:1 interleave ratio, one capture frame 404 may be interleaved between two data frames 402 to capture the image data 406 at 20 fps. As another example, for 120 fps video, using a 2:1 interleave ratio, one capture frame 404 may be interleaved between two data frames 402 to capture the image data 406 at 40 fps. As yet another example, for 120 fps video, using a 3:1 interleave ratio, one capture frame 404 may be interleaved between three data frames 402 to capture the image data 406 at 30 fps. Of course, other interleave ratios may be used based on the capabilities of the display device 102, the capabilities of a graphic processing unit (GPU) providing video data to the display device 102, the transmission bandwidth for video conferencing, and the like.

Figure 5:
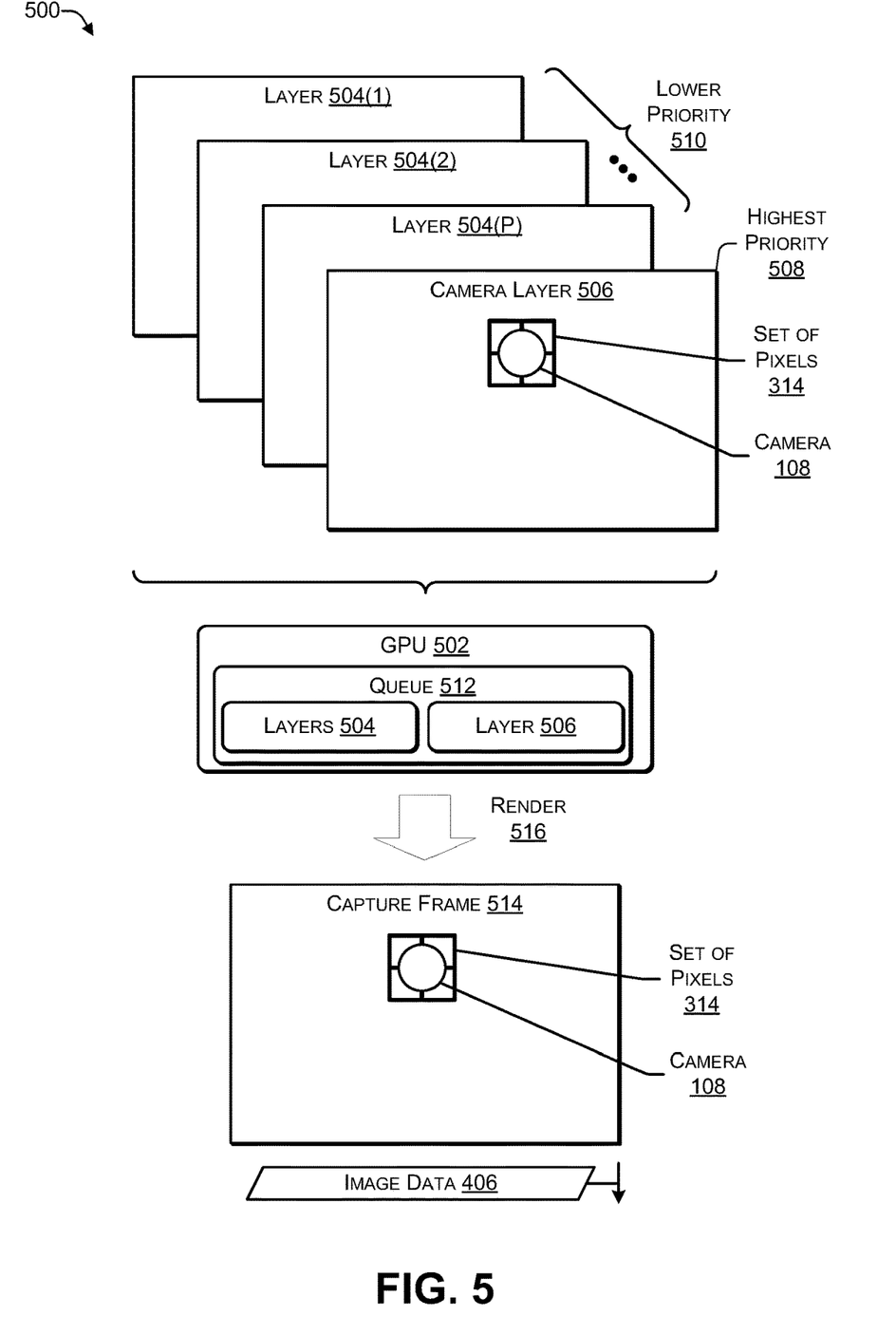
FIG. 5 is a block diagram combining multiple layers to create a capture frame according to some embodiments.

FIG. 5 is a block diagram 500 illustrating combining multiple layers to create a capture frame according to some embodiments. To create a frame to be displayed on a display device, a graphic processing unit (GPU) 502 may layer multiple layers 504(1), 504(2) to 504(P) (P>1). Each of the layers 504 may have a particular priority, with a higher priority layer being displayed on top of a lower priority layer. For example, an operating system (e.g., Microsoft Windows®) may display a desktop (e.g., layer 504(1) with a priority of 1) with various icons, such as an icon of an application, an icon of a file, an icon of a folder, and the like. The icons have a higher priority (e.g., the icons are in layer 504(2) with a priority of 2) than the desktop and are therefore displayed on top of the desktop. When a user opens a folder, at least a portion of the contents of the open folder are displayed. The open folder has a higher priority (e.g., the folder is in layer 504(3) with a priority of 3) than the icons and therefore covers any icons located below the open folder, as well as a portion of the desktop that is located below the open folder.

To create a capture frame 514 (e.g., one of the capture frames 404 of FIG. 4), the GPU 502 may create a camera layer 506 that includes transparent pixels to enable the camera 108 to capture the image data 406. For example, the GPU 502 may cause the set of pixels 314 that cover at least a portion of the camera 108 to have a black value (e.g., each of E 304, G 308, and B 310 of FIG. 3 do not emit a color), resulting in the set of pixels 314 being transparent. The GPU 502 may assign a highest priority 508 to the camera layer 506. Each of the layers 504 has a lower priority 510 as compared to the highest priority 508.

The GPU 502 may place the layers 504, 506 into a queue 512 and render 516 the capture frame 514 based on the layers 504, 506. In the capture frame 514 (e.g., one of the capture frames 404 of FIG. 4), the set of pixels 314 located in front of the camera 108 are turned off, making the set of pixels 314 transparent, enabling the camera 108 to capture the image data 406. The GPU 502 may be standalone device (e.g., on a circuit board or on a motherboard) or the GPU 502 may be integrated into a central processing unit (CPU).

Figure 6:
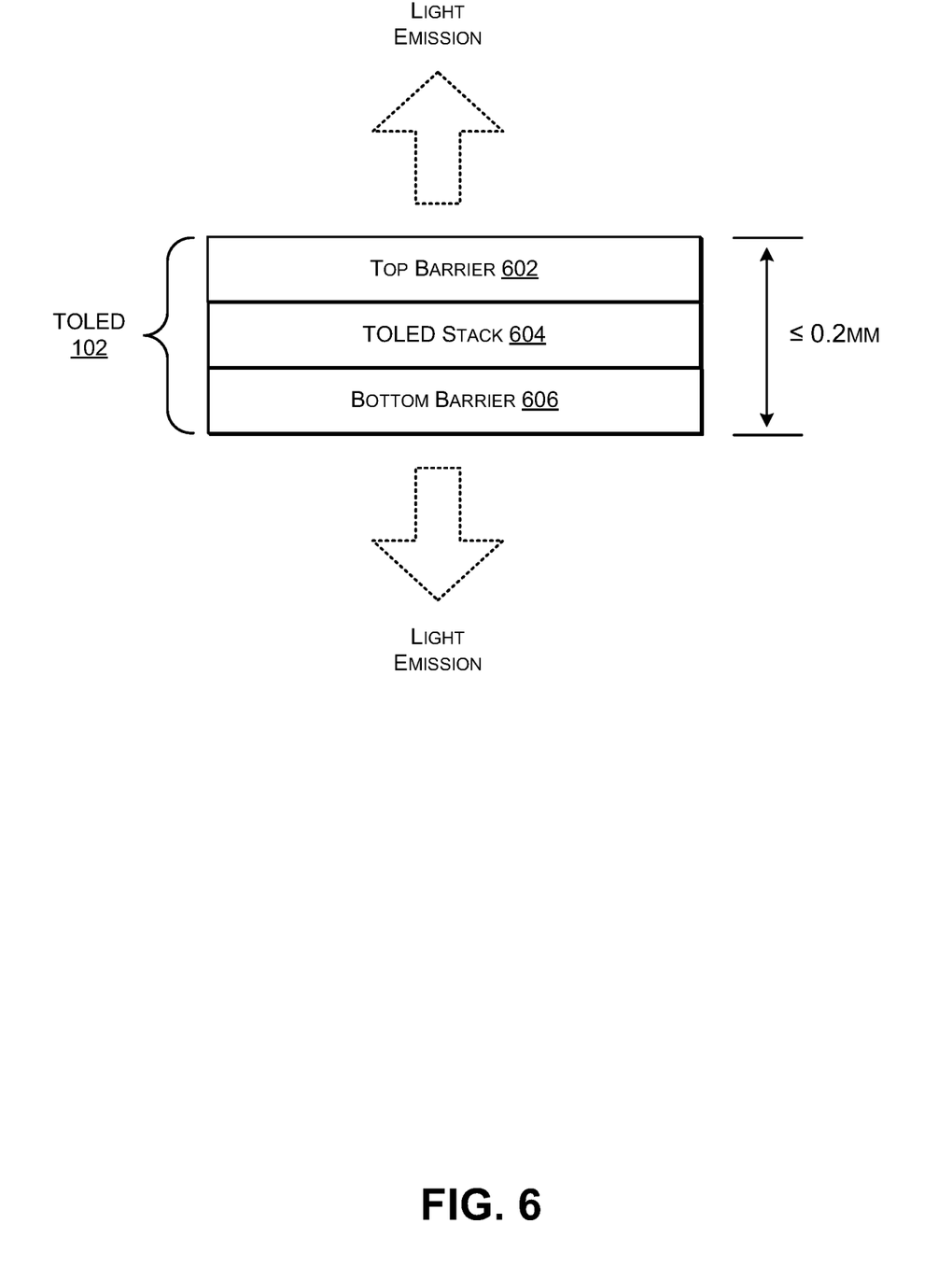
FIG. 6 is a block diagram illustrating a transparent organic light emitting diode (TOLED) sheet (e.g., panel) according to some embodiments.

FIG. 6 is a block diagram 600 illustrating a transparent organic light emitting diode (TOLED) sheet (e.g., panel) according to some embodiments. For example, the TOLED panel 102 may include several layers, including a top barrier 602, a TOLED stack 604, and a bottom barrier 606. The total width of the TOLED panel 102 may be 0.2 mm or less. For example, in some implementations, the TOLED panel 102 may be 0.1 mm or less in thickness. The TOLED stack 604 may be about 100-200 nanometers (nm) in width.

Figure 7:
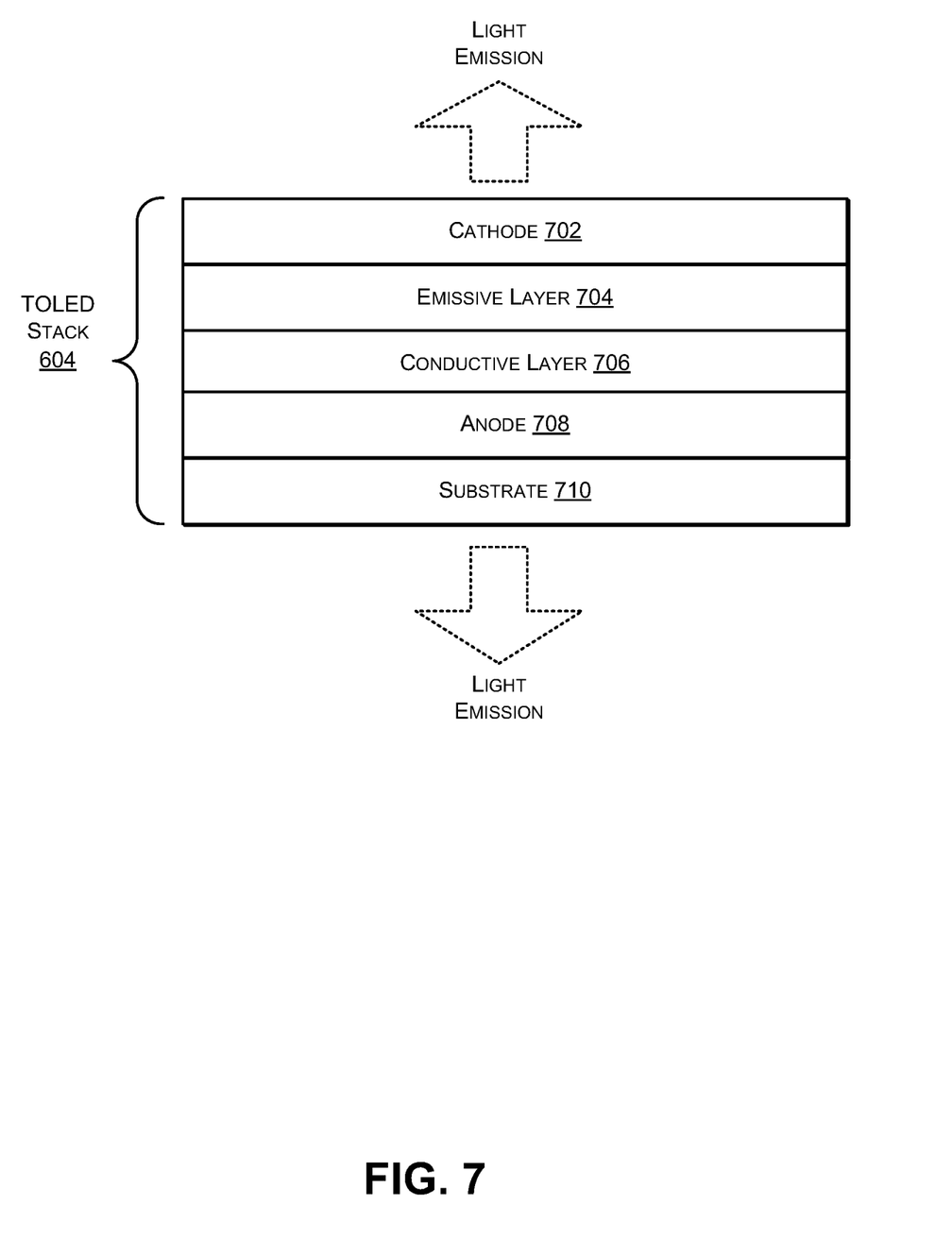
FIG. 7 is a block diagram illustrating components of a TOLED stack according to some embodiments.

FIG. 7 is a block diagram 700 illustrating components of a TOLED stack according to some embodiments. The TOLED stack 604 may be between about 100 to about 200 nanometers (nm) in width and may include a cathode (e.g., negative terminal) 702, an emissive layer 704, a conductive layer 706, an anode (e.g., positive terminal) 708, and a substrate 710. The cathode 702 may inject electrons into the emissive layer 704. The anode 708 may remove electrons.

Power (e.g., direct current) is provided to the TOLED stack 604 via the anode 708 and the cathode 702. After power is applied, the cathode 702 receives electrons from the power source and the anode 708 removes the electrons. The added electrons cause the emissive layer 704 to be negatively charged (similar to an n-type layer in a junction diode), while the conductive layer 706 becomes positively charged (similar to p-type material). Positive holes jump boundary from the conductive layer 706 to the emissive layer 704. When a positive hole (a lack of an electron) meets an electron, the two cancel each other out, thereby releasing a brief burst of electromagnetic energy in the form of light (e.g., a photon). This process of a positive hole meeting an electron occurs many times a second, causing the TOLED stack 604 to produce light when power is being applied to the cathode 702 and the anode 708. The substrate 710 may be made of glass or a clear plastic.

Figure 8:
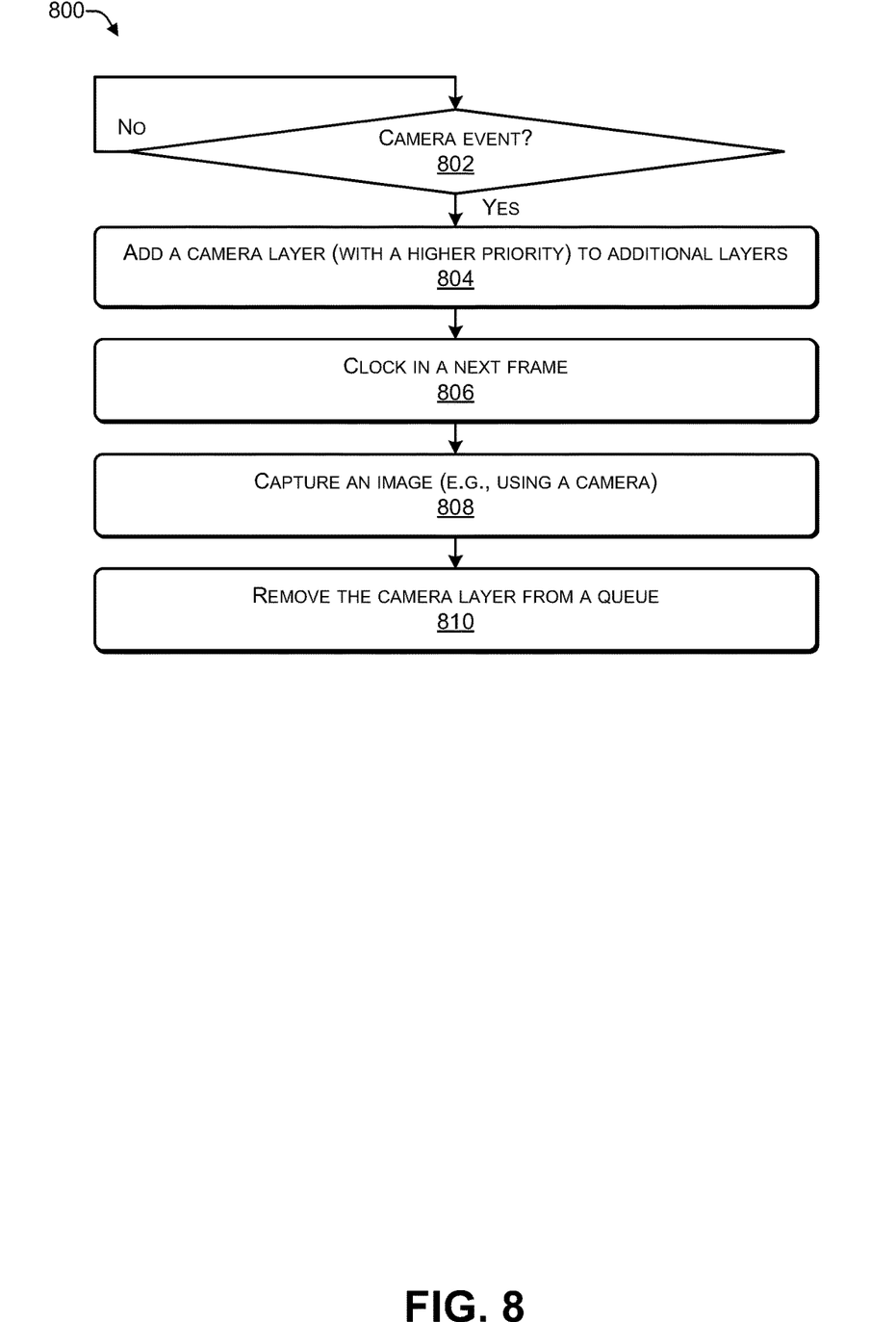
FIG. 8 is a flow diagram of a process that includes adding a camera layer to multiple layers according to some embodiments.
Figure 9:
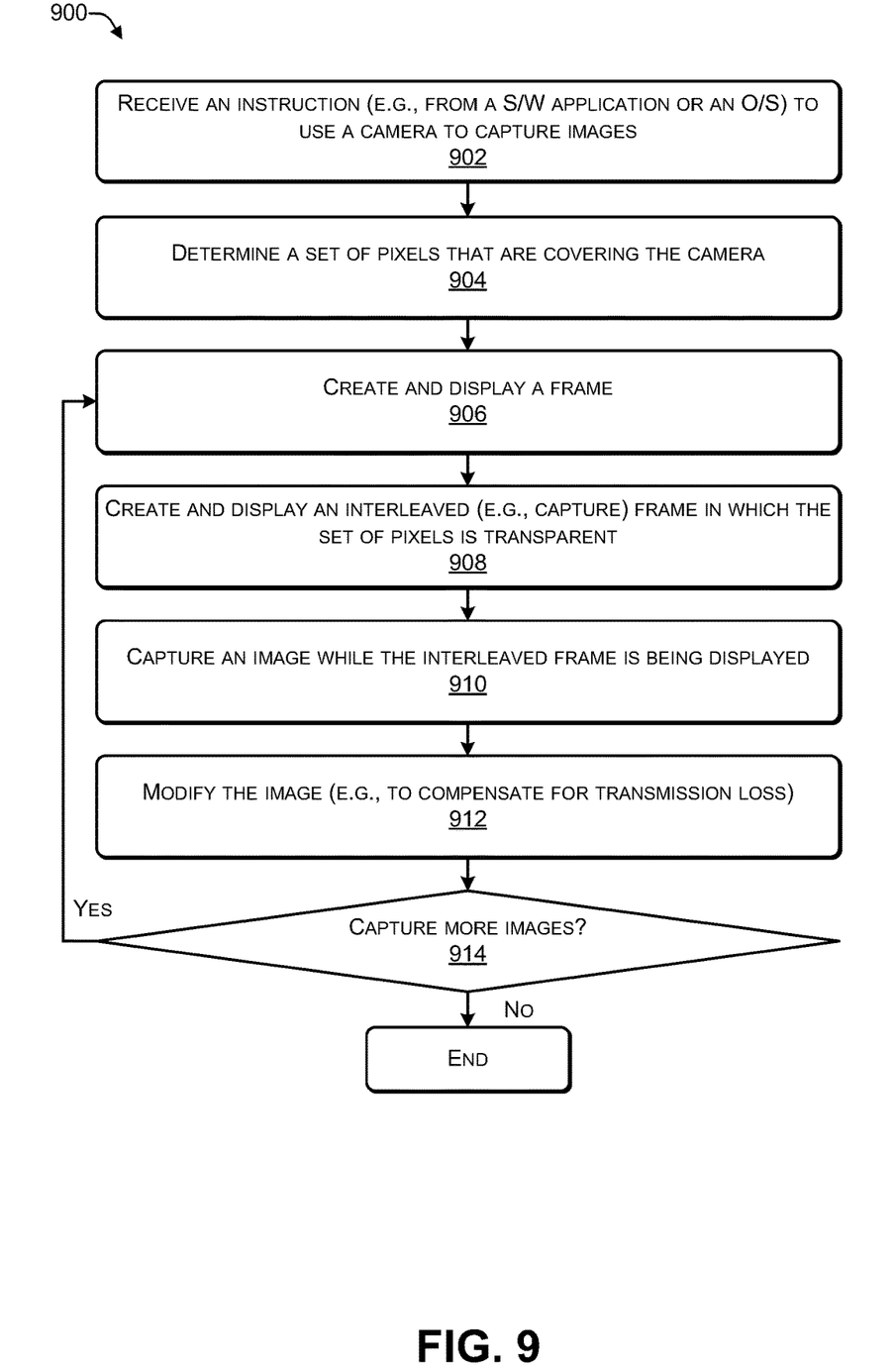
FIG. 9 is a flow diagram of a process that includes capturing an image using a camera behind a display panel according to some embodiments.

In the flow diagram of FIGS. 8 and 9, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the processes 800 and 900, are described with reference to FIGS. 1, 2, 3, 4, 5, 6, and 7 as described above, although other models, frameworks, systems and environments may be used to implement these processes.

FIG. 8 is a flow diagram of a process 800 that includes adding a camera layer to multiple layers according to some embodiments. The process may be performed by one or more components of a computing device, such as a CPU or the GPU 502.

At 802, the process may determine whether a camera event (e.g., capture image data using the camera) is to occur. If the process determines, at 802, that "no" a camera event does not occur, then the process may wait for a notification of the camera event. If the process determines, at 802, that "yes" a camera event is to occur, then the process may proceed to 804. At 804, the process may add a camera layer to additional layers of a frame. The process may assign the camera layer a higher priority than each of the additional layers of the frame. At 806, the process may clock in a next frame. At 808, the process may capture an image (e.g., using a camera). At 810, the camera layer may be removed from a queue (of the GPU).

For example, in FIG. 5, the GPU 502 may determine that a camera event is to occur, e.g., the camera is to capture the image data 406. The GPU 502 may determine (e.g., calculate) the various layers 504 for the capture frame 514 and place each of the layers 504 in the queue 512. The GPU 502 may create the camera layer 506 and assign the camera layer 506 the highest priority 508 (e.g., a priority that is higher than the low priorities of the additional layers 504). The camera layer 506 may set the set of pixels 314 to have a black value (e.g., off) to enable the pixels in front of the camera 108 to be transparent. The GPU 512 may place the additional layers 504 in the queue 512. The GPU 502 may render 516 the layers 504 and the camera layer 506 with the set of pixels 314 transparent to enable the camera 108 to capture the image data 406. After the camera 08 has captured the image data 406, the GPU 502 may remove the camera layer 506 from the queue 512.

FIG. 9 is a flow diagram of a process 900 that includes capturing an image using a camera located behind a display panel (e.g., the TOLED panel 106) according to some embodiments. The process 900 may be performed by one or more components of a computing device, such as, for example, a CPU or the GPU 502.

At 902, the process may receive an instruction (e.g., from a software application or an operating system) to use a camera to capture one or more images. At 904, the process may determine a set of pixels that cover (e.g., are in front of) the camera. At 906, the process may create and display a frame. At 908, the process may create and display a frame in which the set of pixels is transparent (e.g., the pixels are set to display the color black by turning off each of R 306, G 308, and B 310). At 910, the process may capture an image using a camera while the interleaved frame is being displayed. At 912, the captured image may be modified (e.g., to compensate for transmission loss caused by the substrate). At 914, a determination may be made whether more images are to be captured. If a determination is made, at 914, that "yes", additional images are to be captured, then the process may proceed to 906 to display a next frame (and to display a next interleaved frame at 908). If a determination is made, at 914, that "no", additional images are not to be captured, then the process may end.

For example, in FIGS. 4 and 5, the GPU 502 may receive an instruction to capture an image using the camera 108. The GPU 502 may determine that the set of pixels 314 are located in front of the camera 506. The GPU 502 may create (e.g., by combining multiple layers, such as the layers 504) and display a frame, such as, for example, the data frame 402(1). The GPU 502 may create and display an interleaved capture frame, such as, for example, the capture frame 404(1) in which the set of pixels 314 are uncolored. The uncolored set of pixels 314 may result in the TOLED panel 106 of FIG. 1 having transparent pixels in front of the camera 108, enabling the camera 108 to capture an image. The GPU 502 may perform one or more modifications to the image, such as, for example, modifying a color balance, a sharpness, a saturation, a brightness, a contrast, another parameter, or any combination thereof of the image. The modifications may be performed to compensate for transmission loss caused by the substrate 710 of FIG. 7. For example, even when the pixels are transparent, the properties of the substrate 710, which is typically made of glass or plastic, cause a transmission loss of light that is between about 15% to 30%. The transmission loss may result in an image that appears "dull". The modifications to the image may compensate for the transmission loss. For an application such as video conferencing, the process may repeat 906, 908, 910, 912, and 914 until the application is closed.

Figure 10:
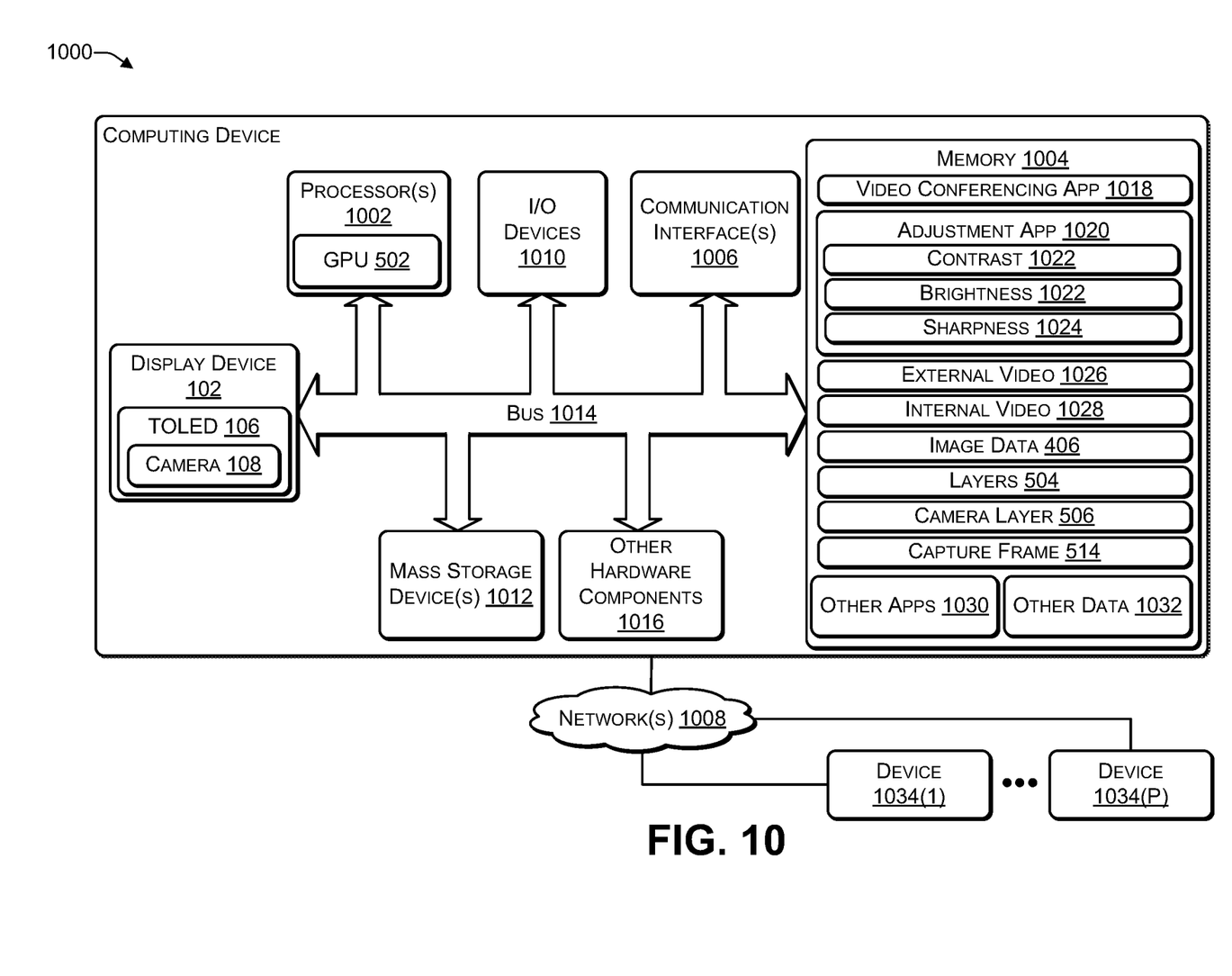
FIG. 10 illustrates an example configuration of a computing device that can be used to implement the systems and techniques described herein.

FIG. 10 illustrates an example configuration of a computing device 1000 that can be used to implement the systems and techniques described herein. For example, the computing device 1000 may be used in an intelligent display device, such as the display device 102 of FIG. 1, or to implement a computing device (e.g., smartwatch, smartphone, tablet, laptop, desktop, or the like) that is connected to the display device 102. The computing device 102 may include one or more processors 1002 (e.g., a CPU, the GPU 502, and the like), a memory 1004, communication interfaces 1006 (e.g., Ethernet, Wi-Fi, and the like), input devices 1010 (e.g., the keyboard 114 and touchpad 116 of FIG. 1, trackball, and the like), and mass storage devices 1012, and other hardware components 1016 configured to communicate with each other, such as via one or more system buses 1014 or other suitable connections. While a single system bus is illustrated for ease of understanding, it should be understood that the system buses 1016 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 1002 are one or more hardware devices that may include a single processing unit or a number of processing units, all of which may include single or multiple computing units or multiple cores. The processors 1002 may be implemented as one or more microprocessors, microcomputers, microcontrollers, digital signal processors, central processing units, graphics processing units, state machines, logic circuitries, and/or any hardware device that can manipulate signals based on operational instructions. Among other capabilities, the processors 1002 may be configured to fetch and execute computer-readable instructions stored in the memory 1004, mass storage devices 1012, or other computer-readable media.

Memory 1004 and mass storage devices 1012 are examples of computer storage media (e.g., memory storage devices) for storing instructions that can be executed by the processors 1002 to perform the various functions described herein. For example, memory 1004 may include both volatile memory and non-volatile memory (e.g., RAM, ROM, or the like) devices. Further, mass storage devices 1012 may include hard disk drives, solid-state drives, removable media, including external and removable drives, memory cards, flash memory, floppy disks, optical disks (e.g., CD, DVD), a storage array, a network attached storage, a storage area network, or the like. Both memory 1004 and mass storage devices 1012 may be collectively referred to as memory or computer storage media herein, and may be any type of non-transitory media capable of storing computer-readable, processor-executable program instructions as computer program code that can be executed by the processors 1002 as a particular machine configured for carrying out the operations and functions described in the implementations herein.

The computing device 102 may also include one or more communication interfaces 1006 for exchanging data via a network 1008. The communication interfaces 1006 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 1006 can also provide communication with external storage, such as a storage array, network attached storage, storage area network, cloud storage, or the like.

The computer storage media, such as memory 1004 and mass storage devices 1012, may be used to store software and data. For example, the computer storage media may be used to store a video conferencing application ("app") 1018 and an adjustment app 1020 to make adjustments to image data 406, such as modifying a contrast 102, a brightness 1022, a sharpness 1024, and other parameters associated with the image data 406 to compensate for transmission loss through the substrate of the TOLED 102. The memory 1004 may be used to store external video data 1026 (e.g., from devices of participants in a video conference) received via the network 1008 from one or more devices 1034(1) to 1034(P) (P>0). The memory 1004 may be used to store internal video data 1028 captured by the camera 108. The memory 1004 may be used to store the image data 406, the layers 504, the camera layer 506, the capture frame 514, other apps 1030, and other data 1032.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A computing device comprising:
a display panel comprising a transparent organic light emitting diode (TOLED) panel;
a camera located behind a particular portion of the display panel;
a processor comprising a graphic processing unit (GPU); and
one or more non-transitory computer-readable storage media to store instructions that are executable by the processor to perform operations comprising:
using the GPU to create a camera layer, wherein
the camera layer includes a set of pixels overlying the portion of the camera at the particular portion of the display panel;
the set of pixels overlying the portion of the camera are set by the GPU to a transparent state;
generating a capture frame in which the GPU displays a plurality of layers including the camera layer, wherein the camera layer is set to a highest priority layer of the plurality of layers;
generating a video frame in which the GPU displays a plurality of layers, wherein the video frame does not include a camera layer at the highest priority of the plurality of layers;
using the GPU to instruct the display panel to display the capture frame; and instructing the camera located behind the particular portion of the display panel to capture image data while the display panel displays the capture frame;

wherein the capture frame, when displayed on the display panel, comprises pixels of one or more lower priority layers; and using the GPU to interleave the capture frame and the video frame to provide high-quality video output to the display panel while providing high-quality video output using the camera.

2. The computing device of claim 1, wherein setting the set of pixels covering the particular portion of the display panel to be clear pixels comprises:

determining the set of pixels covering the particular portion of the display panel; and setting individual pixels of the set of pixels to not emit a color.

3. The computing device of claim 1, wherein the operations further comprise:

performing a modification to the image data to create modified image data, wherein the modification comprises at least one of:

increasing a brightness of the image data;
increasing a contrast of the image data;
increasing a saturation of the image data;
increasing a sharpness of the image data; or
adjusting a white balance of the image data.

4. The computing device of claim 1, further comprising:
a first housing in which the display panel and the camera are located; and
a second housing in which the processor and the one or more non-transitory computer-readable storage media are located.

5. The computing device of claim 1, wherein:
a thickness of the TOLED panel is 0.2 millimeters or less.

6. A computing device comprising:
a first housing comprising:
a display panel comprising a transparent organic light emitting diode (TOLED) panel; and
a camera located behind a particular portion of the display panel; and
a second housing comprising:
a processor comprising a graphic processing unit (GPU); and
a memory storing instructions that are executable by the processor to perform operations comprising:
using the GPU to create a camera layer, wherein the camera layer includes a set of pixels overlying the portion of the camera at the particular portion of the display panel, and
the set of pixels overlying the portion of the camera are set by the GPU to a transparent state;
generating a capture frame in which the GPU displays a plurality of layers including the camera layer, wherein the camera layer is set to a highest priority layer of the plurality of layers;
generating a video frame in which the GPU displays a plurality of layers, wherein the video frame does not include a camera layer at the highest priority of the plurality of layers;
using the GPU to instruct the display panel to display the capture frame; and
instructing the camera located behind the particular portion of the display panel to capture image data while the capture frame is displayed;

wherein the capture frame, when displayed on the display panel, includes pixels of one or more lower priority layers; and using the GPU to interleave the capture frame and the video frame to provide high-quality video output to the display panel while also providing high-quality video output from the camera.

7. The computing device of claim 6, wherein setting the set of pixels covering the particular portion of the display panel to be clear pixels comprises:

determining the set of pixels covering the particular portion of the display panel; and setting individual pixels of the set of pixels to a black colored pixel.

8. The computing device of claim 6, wherein the operations further comprise:

performing a modification to the image data to create modified image data, wherein the modification comprises at least one of:

increasing a brightness of the image data;
increasing a contrast of the image data;
increasing a saturation of the image data;
increasing a sharpness of the image data; or
adjusting a white balance of the image data.

9. The computing device of claim 6, wherein:
the capture frame is displayed on the display panel at a rate between:
one thirtieth of a second; and
one sixtieth of a second.

10. The computing device of claim 6, wherein:
a thickness of the TOLED panel is 0.2 millimeters or less.

11. A computing device comprising:
a processor comprising a graphic processing unit (GPU); and
a memory storing instructions that are executable by the processor to perform operations comprising:
using the GPU to generate a camera layer, wherein the camera layer includes a set of pixels overlying a camera disposed behind a display;
the set of pixels overlying the camera are set by the GPU to a transparent state;
generating a capture frame in which the GPU displays a plurality of layers including the camera layer, wherein the camera layer is set to a highest priority layer of the plurality of layers;
generating a video frame in which the GPU displays a plurality of layers, wherein the video frame does not include a camera layer at the highest priority of the plurality of layers;
using the GPU to instruct a display device that is connected to the computing device to a display the capture frame, wherein the capture frame, when displayed on the display device, comprises pixels of one or more lower priority layers;
instructing a camera located behind a display panel of the display device to capture image data; and
using the GPU to interleave the capture frame and the video frame to provide high-quality video output to the display device while also providing high-quality video output using the camera.

12. The computing device of claim 11, wherein:
the display panel comprises a transparent organic light emitting diode (TOLED).

13. The computing device of claim 11, wherein setting the set of pixels overlying the camera comprises setting the set of pixels to be black colored pixels.

14. The computing device of claim 11, wherein the operations further comprise:
performing a modification to the image data to create modified image data, wherein the modification comprises at least one of:
increasing a brightness of the image data;
increasing a contrast of the image data;
increasing a saturation of the image data;
increasing a sharpness of the image data; or
adjusting a white balance of the image data.

* * * * *